United States Patent [19]

Matsukawa et al.

[11] Patent Number: 5,391,509
[45] Date of Patent: Feb. 21, 1995

[54] METHOD OF MANUFACTURING A SEMICONDUCTOR DEVICE FORMING A HIGH CONCENTRATION IMPURITY REGION THROUGH A CVD INSULATING FILM

[75] Inventors: Naoki Matsukawa; Makoto Mizuno; Katsuhiro Shimazu, all of Chiba, Japan

[73] Assignee: Kawasaki Steel Corporation, Kobe, Japan

[21] Appl. No.: 164,954

[22] Filed: Dec. 10, 1993

[30] Foreign Application Priority Data

Dec. 15, 1992 [JP] Japan .................. 4-334566

[51] Int. Cl.⁶ ............................ H01L 21/265
[52] U.S. Cl. ........................... 437/44; 437/29
[58] Field of Search ........................ 437/44, 29

[56] References Cited

U.S. PATENT DOCUMENTS

| | | |
|---|---|---|
| 5,073,514 | 12/1991 | Ito et al. .................... 437/29 |
| 5,146,291 | 9/1992 | Watabe et al. ............... 437/44 |
| 5,217,912 | 6/1993 | Ayukawa et al. . | 
| 5,268,317 | 12/1993 | Schwalke et al. ............. 437/29 |
| 5,292,671 | 3/1994 | Odanaka .................... 437/29 |
| 5,306,655 | 4/1994 | Kurimoto ................... 437/44 |

Primary Examiner—Brian E. Hearn
Assistant Examiner—Lynne A. Gurley
Attorney, Agent, or Firm—Oliff & Berridge

[57] ABSTRACT

Impurities are introduced into a semiconductor substrate by using a gate electrode formed on the semiconductor substrate through an oxide film as a mask, and low concentration impurity regions are formed. Then, side walls are formed on the gate electrode. Next, after an insulating film is formed on the whole surface of the substrate by a CVD method, impurities are introduced by using the gate electrode and the side walls as a mask, and high concentration impurity regions are formed. Then, a thermal treatment of the substrate is performed, and after the low concentration impurity regions and the high concentration impurity regions are crystallized, an interlayer insulating film is formed.

9 Claims, 2 Drawing Sheets

METHOD OF MANUFACTURING A SEMICONDUCTOR DEVICE FORMING A HIGH CONCENTRATION IMPURITY REGION THROUGH A CVD INSULATING FILM

BACKGROUND OF THE INVENTION

1. Field of the Invention

The present invention relates to a method of manufacturing a semiconductor device, and in particular, to a method of manufacturing a semiconductor device having a MOS (Metal Oxide Semiconductor) structure.

2. Description of the Prior Art

Heretofore, in LSIs (Large Scale Integrated circuit), finer and higher integrated devices have been demanded. Due to the progress in the finer and higher integrated devices, the gate length of MOS transistors is further reduced, and as a result of this, the hot electron effect and the like are apt to be occurred.

Accordingly, in recent years, a MOS transistor structure having an LDD (Lightly Doped Drain) structure has been introduced. In the LDD structure, in order to suppress the occurrence of the hot electron effect, the impurity concentration of the source and drain in the vicinity of the gate side is reduced (a low concentration impurity region is formed), and the generation of hot carriers is disturbed by lowering electric field in these portions.

The MOS transistor having the above-mentioned LDD structure is generally manufactured by the following method.

First, a gate electrode is formed on a substrate interposed by a gate oxide film. Subsequently, impurity ions are introduced into both sides (source and drain regions) of a channel region by using the gate electrode as a mask, and low concentration impurity regions are formed in these portions. Then, side walls composed of silicon oxide film ($SiO_2$ film) are formed on side surfaces of the gate electrode. At this time, in etching back the silicon oxide film, the surfaces of the substrate corresponding to the source and drain are exposed.

Next, the wafer is subjected to a thermal oxidation treatment in an oxidation atmosphere of $O_2$ or $H_2O$ at about 800° to 900° C. to Grow silicon oxide film on the whole surface of the source and drain regions, which serves as a buffer film at the time of impurity introduction to form a high concentration impurity region which is performed in a subsequent process.

Next, impurity ions are introduced into both sides of the side walls by using the side walls and the gate electrode as a mask to form high concentration impurity regions at these portions. By this impurity ion introduction, the source and drain regions are turned into amorphous.

Then, after depositing an interlayer insulating film on the whole surface of the wafer, a thermal treatment is performed at 800° to 900° C. in order to flatten the interlayer insulating film, and to recrystallize and activate the amorphous source and drain regions.

In this manner, the source and drain of the MOS transistor having the LDD structure was formed. Thereafter, a semiconductor device including the MOS transistor having the LDD structure is completed by performing desired processes.

In the manufacturing process of the MOS transistor having the LDD structure, it is known that at the time of performing anisotropic etching of the silicon oxide film in forming the side walls on the side surfaces of the gate electrode, the etching progresses to reach the substrate surfaces corresponding to the source and drain regions, and the substrate is etched and damaged.

However, in the above-mentioned conventional manufacturing method, the damaged wafer is thermally oxidized, and the silicon oxide film is formed to remove the damaged layer on the substrate. The silicon oxide film serves as a buffer film at the time of impurity introduction for the purpose of forming a high concentration impurity region which is performed in a subsequent process. However, a problem is raised anew in that, at this time, a volume expansion occurs in the oxidized semiconductor substrate, and the stress is concentrated in the periphery of edge portions of the side walls, and in the vicinity of edge portion of the field oxide film. Further, due to this stress concentration, a strain is produced in the substrate at a portion corresponding to the stress concentration, and a crystal defect is caused in an amorphous layer formed at the time of impurity introduction for the purpose of formation of a high concentration impurity region which is performed in a subsequent process. This defect remains after the introduction of the impurities, and the problem is caused in that a junction leakage occurs in the high concentration impurity region of the source and drain regions.

Furthermore, another problem is involved in that since the interlayer insulating film has been formed on the source and drain regions, at the time of thermal treatment which is performed in order to flatten the interlayer insulating film, and to both crystallize the portion transformed into the amorphous state, an undesired stress is imparted from the interlayer insulating film, and a stress is imparted between the interlayer insulating film and the substrate due to a thermal strain. And because of this stress, a defect is caused in edge portions of the side walls and in edge portion of the field oxide film, and a junction leakage is apt to be caused in the high concentration impurity region, and a defective device is resulted.

SUMMARY OF THE INVENTION

The present invention solves the problems mentioned above, and it is an object to provide a manufacturing method of a semiconductor device which prevents the occurrence of the junction leakage in a high concentration impurity region of source and drain regions having an LDD structure.

In order to achieve the object, in one aspect of a manufacturing method of a semiconductor device according to the present invention, impurities are introduced by using a gate electrode formed on a substrate through a gate oxide film as a mask, forming a low concentration impurity region, and after forming side walls on side surfaces of the gate electrode, instead of thermally oxidizing a surface of the substrate and forming an oxide film which serves as a buffer film at the time of introduction of high concentration impurities, an insulating film is formed by a chemical vapour deposition method on the whole surface of the substrate having side walls formed thereon.

In another aspect of the present invention, after the insulating film is formed, impurities are introduced by using the Gate electrode and the side walls as a mask and a high concentration impurity region is formed, and after the wafer having the high concentration impurity region formed therein is subjected to a thermal treatment and surface layers of the low concentration impurity region and the high concentration impurity region are crystallized, an interlayer insulating film is formed on the whole surface of the wafer after the thermal treatment.

In the present invention, at the time of forming the side walls, even when the etching is progressed to reach the surface of the substrate corresponding to the source and drain regions so that the portions of the substrate are damaged and shaved, since the insulating film which is formed in the subsequent process can be deposited by the chemical vapour deposition method, it is possible to form the insulating film which serves as a buffer film at the time of introducing the impurities to form the high concentration impurity region, without producing the stress and strain in the substrate.

Specifically, the formation of the insulating film by the chemical vapour deposition method differs from the film formation by the thermal oxidation, and the insulating film is formed by deposition on the substrate as if the snow falls, the volume expansion never occurs in the substrate. Accordingly, since the stress and the strain are not produced at the edge portions of the side walls and at the edge portion of the field oxide film, the crystal defect never occurs in the amorphous layer formed at the time of impurity introduction to form the high concentration impurity region which is performed in the subsequent process.

Furthermore, since the thermal treatment to recrystallize the amorphous portion formed at the time of introduction of the impurities into the high concentration impurity region is performed before forming the interlayer insulating layer, as compared with the prior art method, an undesired stress is not imparted to the semiconductor substrate from the interlayer insulating layer at the time of thermal treatment, and at the same time, the stress due to the thermal strain does not occur between the interlayer insulating layer and the semiconductor substrate. As a result, it is possible to prevent the occurrence of the defect in the periphery of the edge portions of the side walls and in the vicinity of the edge portion of the field oxide film, and to prevent the occurrence of the defect in the substrate.

DESCRIPTION OF THE PREFERRED EMBODIMENT

Figure 1:
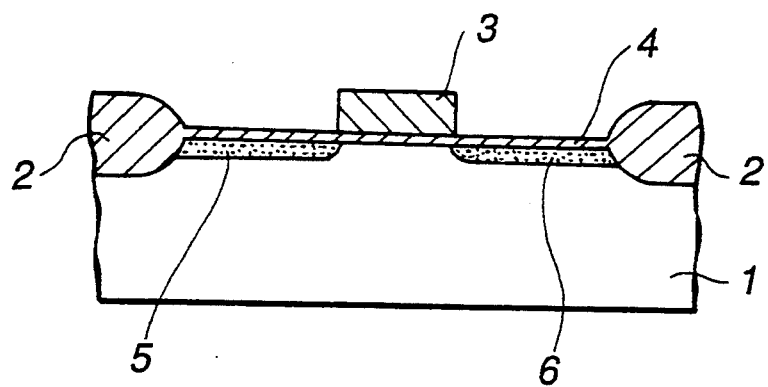
FIGS. 1a to 1e are respectively partial sectional views each illustrating a part of manufacturing process of a semiconductor device in an embodiment of the present invention.
Figure 1:
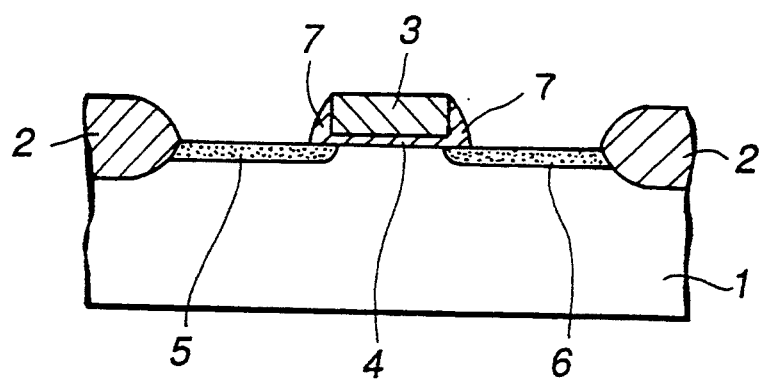
Figure 1:
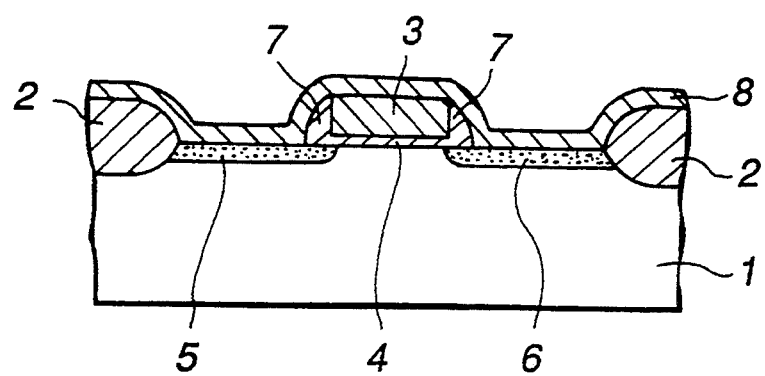
Figure 1:
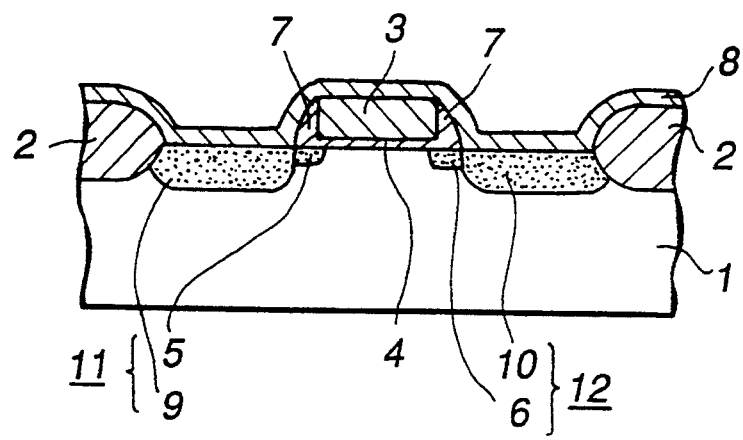
Figure 1:
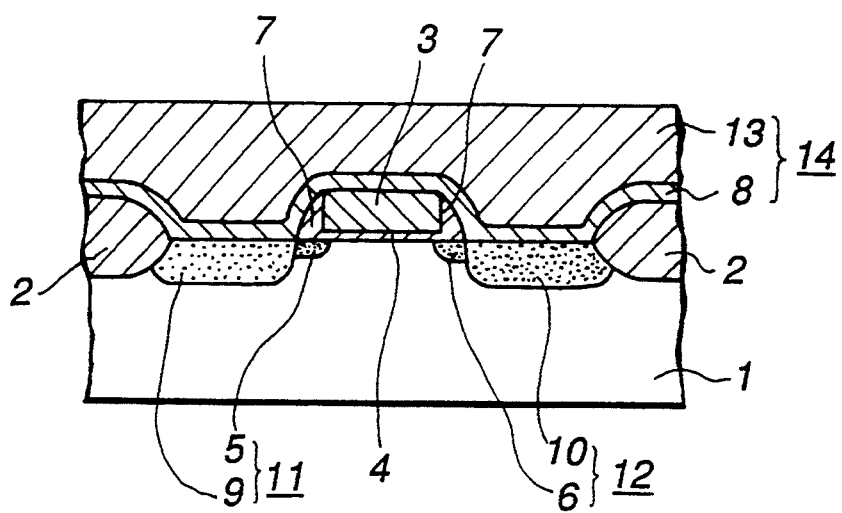

In a process shown in FIG. 1a, a field oxide film 2 is formed in a device isolation region of a p-type semiconductor substrate 1 by a known method. Next, after forming a gate oxide film 4 of about 150 Å in film thickness in the device formation region of the semiconductor substrate 1, a polysilicon film of about 3500 Å in film thickness is deposited on the whole surface, and a gate electrode 3 is formed by patterning the polysilicon film. Subsequently, by using the gate electrode 3 as a mask, low concentration impurity regions 5 and 6 are formed by ion implanting phosphorous in source and drain regions of the semiconductor substrate 1 at an acceleration voltage=50 KeV and an amount of implantation=$2 \times 10^{13}$ cm$^{-2}$.

In a process shown in FIG. 1b, the wafer obtained by the process shown in FIG. 1a is subjected to a CVD method using $SiH_4$ and $N_2O$ under the condition of 825° C. and 100 Pa, and a silicon oxide film of about 2200 Å in film thickness is deposited on the whole surface of the wafer. Next, the whole surface of the silicon oxide film is subjected to etching back by ion etching, and side walls 7 consisting of the silicon oxide are formed on side surfaces of the gate electrode 3. At this time, the etching back is performed until the surfaces of the semiconductor substrate 1 corresponding to the low concentration impurity regions 5 and 6 are exposed.

In a process shown in FIG. 1c, the wafer obtained by the process shown in FIG. 1b is subjected to the CVD method using $SiH_4$ and $N_2O$ under the condition of 825° C. and 100 Pa, and a silicon oxide film of about 100 Å in film thickness is deposited on the whole surface of the wafer, and an insulating film 8 is formed, which serves as a buffer film in the ion implantation to form a high concentration impurity region which is performed in a subsequent process. At this time, since the insulating film 8 is formed by the CVD method, the silicon oxide film is deposited on the wafer as if the snow falls and the insulating film 8 is formed. Accordingly, different from the silicon oxide film formed by the thermal oxidation, a volume expansion does not occur in the semiconductor substrate 1. As a result, the insulating film 8 can be formed without producing the stress and strain in edge portions of the side walls 7 and edge portion of the field oxide film 2.

In a process shown in FIG. 1d, by using the side walls 7 and the gate electrode 3 as a mask, high concentration impurity regions 9 and 10 are formed by ion implanting arsenic into the source and drain regions at an acceleration voltage=40 Kev and an amount of implantation=$3 \times 10^{15}$ cm$^{-2}$. At this time, a surface of the semiconductor substrate 1 in which the ions are implanted is transformed into an amorphous state. Next, the wafer obtained is subjected to a thermal treatment at 800 Å for 80 minutes, and the low concentration impurity regions 5 and 6, and the high concentration impurity regions 9 and 10 are crystallized (crystal restoration). In this manner, a source 11 consisting of the low concentration impurity region 5 and the high concentration impurity region 9, and a drain 12 consisting of the low concentration impurity region 6 and the high concentration impurity region 10 are formed. Here, at the time of performing the thermal treatment for the crystallization, since the interlayer insulating film is not formed on the source 11 and the drain 12 as in the prior art, the stress due to the thermal strain is not produced between the interlayer insulating film and the semiconductor substrate 1 at the time of crystallization. Accordingly, it is possible to prevent the production of a defect in edge portions of the side walls 7 and an edge portion of the field oxide film 2, and the production of a defect in the semiconductor substrate 1 can be prevented.

In a process shown in FIG. 1e, an insulating film 13 of about 8000 Å in film thickness is deposited on the whole surface of the wafer obtained by the process shown in FIG. 1d, and an interlayer insulating film 14 consisting of the insulating film 8 and the insulating film 13 is formed.

Thereafter, desired processes are performed, and a semiconductor device is completed.

While the semiconductor device of the n-channel type is described in the embodiment, it is of course possible to obtain the same advantages when the present invention is applied to a semiconductor device of the p-channel type.

With respect to Samples 1 to 3 manufactured by the methods according to the present invention are evaluated as to the occurrence rate of defects due to the junction leakage in accordance with. Evaluation Elements A, B and C.

In the Sample 1, the insulating film which serves as a buffer film for ion implantation to form the high concentration impurity region is formed by the CVD method.

In the Sample 2, the thermal treatment for recrystallizing the amorphous layer, which is performed after the formation of the high concentration impurity region is performed before the interlayer insulating film is formed.

In the Sample 3, the insulating film which serves as a buffer film for ion implantation to form the high concentration impurity region is formed by the CVD method, and the thermal treatment for recrystallizing the amorphous layer, which is performed after the formation of the high concentration impurity region is performed before the interlayer insulating film is formed.

Evaluation Element A

A voltage of 7 V is applied (reverse bias application) to an n+ diffusion layer assembly having an area of 1.6 $\mu m \times 4$ $\mu m$ and fifty n+ diffusion layers connected in parallel (each n+ diffusion layer is surrounded by a field oxide film having a gate electrode thereon, and the ends of side walls of the gate electrode are located in an active region), and a junction leakage current between the n+ diffusion layer assembly and the semiconductor substrate is measured. When the leakage current exceeds 15 pA, it is determined as defective.

Evaluation Element B

A voltage of 7 V is applied (reverse bias application) to a drain of an n-channel Active MOS transistor having a gate length=0.8 $\mu m$ and a gate width=16 $\mu m$, and a junction leakage current between the drain (an area of 2.6 $\mu m \times 16$ $\mu m$) and the semiconductor substrate is measured. When the leakage current exceeds 10 pA, it is determined as defective.

Evaluation Element C

A voltage of 7 V is applied (reverse bias application) to a drain of an n-channel Field MOS transistor (the ends of side walls are located in an active region) having a gate length=0.8 $\mu m$ and a gate width=100 $\mu m$, and a junction leakage current between the drain (an area of 10 $\mu m \times 100$ $\mu m$) and the semiconductor substrate is measured. When the leakage current exceeds 10 pA, it is determined as defective.

The results of the evaluation are shown in Table 1.

For the purpose of comparison, a conventional device is formed by using a conventional thermal oxidation method (a thermal treatment in an oxidation atmosphere:900° C., $O_2$), and also the thermal treatment for recrystallizing the amorphous layer which is performed after the formation of the high concentration impurity region is performed after the interlayer insulating layer is formed. The evaluation was conducted in a similar manner as to the occurrence rate of defects due to the junction leakage. The results of the evaluation are shown in Table 1.

From Table 1, it was confirmed that the defect occurrence rate is very low in the Samples as compared with the Conventional device. In particular, it was confirmed that the occurrence of junction leakage defect can be completely avoided by forming the above-mentioned insulating film by the CVD method, and by performing the thermal treatment for recrystallizing the amorphous layer which is performed after the formation of the the high concentration impurity region is performed before the interlayer insulating layer is formed.

The present invention provides the following advantages.

In the present invention, since the insulating film which serves as a buffer film at the time of impurity introduction to form the high concentration impurity region is formed by the CVD method, the volume expansion never occurs in the semiconductor substrate at the time of forming the insulating film. Accordingly, since the stress and strain are not produced in the semiconductor substrate, the crystal defect does not occur in the amorphous layer which is formed at the time of impurity introduction to form the high concentration impurity region which is performed in a subsequent process.

Furthermore, the thermal treatment for recrystallizing the amorphous portion which is formed when the impurities are introduced into the high concentration impurity region, is performed before the interlayer insulating film is formed. As a result, undesired stress is not imparted from the interlayer insulating film at the time of the thermal treatment, and at the same time, the stress due to the thermal strain never occurs between the interlayer insulating film and the semiconductor substrate. Accordingly, it is possible to prevent the occurrence of the defect in the periphery of the edge portions of the side walls of the semiconductor substrate and in the vicinity of the edge portion of the field oxide film.

Thus, the occurrence of the junction leakage is prevented, and a semiconductor device improved in the reliability and the performance can be provided.

TABLE 1

|  | Defect Rate (%) | | |
| --- | --- | --- | --- |
|  | Evaluation Element A | Evaluation Element B | Evaluation Element C |
| Sample 1 | 8.6 | 0 | 0 |
| Sample 2 | 0 | 0 | 4.0 |
| Sample 3 | 0 | 0 | 0 |
| Conventional Device | 67.2 | 32.3 | 34.0 |

What is claimed is:

1. A method of manufacturing a semiconductor device comprising the steps of:

forming a low concentration impurity region by introducing impurities through a gate insulating film by using a gate electrode formed on a semiconductor substrate as a first mask;

depositing a side wall film on a whole surface of the semiconductor substrate;

forming side walls on side surfaces of the gate electrode, wherein the side wall film and the gate insulating film are etched to expose the substrate above at least a high concentration impurity region;

forming an insulating film on the whole surface of the semiconductor substrate having the side walls formed thereon solely by a chemical vapor deposition method;

after forming the insulating film, forming the high concentration impurity region by introducing impurities and by using the gate electrode and the side walls as a second mask;

performing a thermal treatment of the semiconductor substrate having the high concentration impurity region formed therein to recrystallize surfaces of the low concentration impurity region and the high concentration impurity region; and forming an interlayer insulating film on the whole surface of the semiconductor substrate after the thermal treatment thereof.

2. The method of manufacturing the semiconductor device according to claim 1 wherein the semiconductor substrate is a silicon substrate, and the gate insulating film is a silicon oxide film.

3. The method of manufacturing the semiconductor device according to claim 2, wherein said insulating film is about 100 Å thick.

4. The method of manufacturing the semiconductor device according to claim 3, wherein said side wall film is about 2200 Å thick.

5. The method of manufacturing the semiconductor device according to claim 1, wherein said side wall film depositing step comprises depositing a film of silicon oxide using the chemical vapor deposition method.

6. A method of manufacturing a semiconductor device comprising the steps of:

forming a low concentration impurity region by introducing impurities through a gate insulating film by using a gate electrode formed on a semiconductor substrate as a first mask;

after forming the low concentration impurity region, forming side walls on side surfaces of the gate electrode and etching the gate insulating film adjacent to the side walls to expose the substrate;

after forming the side walls, forming an insulating film on a whole surface of the semiconductor substrate having the side walls formed thereon by using only a chemical vapor deposition method;

after forming the insulating film, forming a high concentration impurity region by introducing impurities and by using the gate electrode and the side walls as a second mask;

performing a thermal treatment of the semiconductor substrate having the high concentration impurity region formed therein to recrystallize surfaces of the low concentration impurity region and the high concentration impurity region; and forming an interlayer insulating film on the whole surface of the semiconductor substrate after the thermal treatment thereof.

7. The method of manufacturing the semiconductor device according to claim 6 wherein the semiconductor substrate is a silicon substrate, and the gate insulating film is a silicon oxide film.

8. A method of manufacturing a semiconductor device comprising the steps of:

forming a low concentration impurity region by introducing impurities through a gate insulating film by using a gate electrode formed on a semiconductor substrate as a first mask;

forming side walls on side surfaces of the gate electrode;

forming an insulating film by a chemical vapor deposition method on a whole surface of the semiconductor substrate having the side walls formed thereon;

forming a high concentration impurity region by introducing impurities and by using the gate electrode and the side walls as a second mask, wherein the insulating film is a sole film on the high concentration impurity region of the semiconductor substrate during formation of the high concentration impurity region;

performing a thermal treatment of the semiconductor substrate having the high concentration impurity region formed therein to recrystallize surfaces of the low concentration impurity region and the high concentration impurity region; and forming an interlayer insulating film on the whole surface of the semiconductor substrate after the thermal treatment.

9. The method of manufacturing the semiconductor device according to claim 8, wherein the semiconductor substrate is a silicon substrate, and the gate insulating film is a silicon oxide film.

* * * * *